(12) United States Patent
Formosa

(10) Patent No.: US 10,329,143 B2
(45) Date of Patent: Jun. 25, 2019

(54) PACKAGE WITH CHAMBERS FOR DIES AND MANUFACTURING PROCESS THEREOF

(71) Applicant: STMicroelectronics (Malta) Ltd, Kirkop (MT)

(72) Inventor: Kevin Formosa, Zabbar (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 0 days.

(21) Appl. No.: 14/977,465

(22) Filed: Dec. 21, 2015

(65) Prior Publication Data

US 2016/0107884 A1 Apr. 21, 2016

Related U.S. Application Data

(63) Continuation of application No. 13/648,213, filed on Oct. 9, 2012, now Pat. No. 9,253,579, which is a (Continued)

(30) Foreign Application Priority Data

Jun. 30, 2011 (IT) ................ TO2011A0577

(51) Int. Cl.
*B81B 7/00* (2006.01)
*B81C 1/00* (2006.01)
(Continued)

(52) U.S. Cl.
CPC .......... *B81B 7/0074* (2013.01); *B81B 7/0061* (2013.01); *B81C 1/00309* (2013.01);
(Continued)

(58) Field of Classification Search
CPC ...... B81B 2201/0257; B81B 2207/012; B81B 7/0061
See application file for complete search history.

(56) References Cited

U.S. PATENT DOCUMENTS 5,633,530 A * 5/1997 Hsu ................ H01L 23/055
257/685
6,335,669 B1 * 1/2002 Miyazaki ............ H01L 23/66
174/384
(Continued)

FOREIGN PATENT DOCUMENTS

DE 102005008512 A1 8/2006
EP 1 755 360 A1 2/2007
(Continued)

*Primary Examiner* — Matthew L Reames
*Assistant Examiner* — Wilner Jean Baptiste
(74) *Attorney, Agent, or Firm* — Seed IP Law Group LLP

(57) ABSTRACT

A packaged MEMS device, wherein at least two support structures are stacked on each other and are formed both by a support layer and a wall layer coupled to each other and delimiting a respective chamber. The chamber of the first support structure is upwardly delimited by the support layer of the second support structure. A first and a second dice are accommodated in a respective chamber, carried by the respective support layer of the first support structure. The support layer of the second support structure has a through hole allowing wire connections to directly couple the first and the second dice. A lid substrate, coupled to the second support structure, closes the chamber of the second support structure.

10 Claims, 10 Drawing Sheets

Related U.S. Application Data continuation of application No. 13/539,068, filed on Jun. 29, 2012, now abandoned.

(51) Int. Cl.
 *H04R 31/00* (2006.01)
 *H04R 19/00* (2006.01)
 *H04R 19/04* (2006.01)

(52) U.S. Cl.
 CPC .......... *H04R 19/005* (2013.01); *H04R 19/04* (2013.01); *H04R 31/00* (2013.01); *B81B 2201/0257* (2013.01); *B81B 2207/012* (2013.01); *H01L 2224/4824* (2013.01); *H01L 2224/48091* (2013.01); *H01L 2224/48137* (2013.01); *H01L 2224/48227* (2013.01); *H04R 2201/003* (2013.01)

(56) References Cited

U.S. PATENT DOCUMENTS

| | | | |
|---|---|---|---|
| 6,938,490 B2* | 9/2005 | Wagner | G01L 9/0042 73/708 |
| 7,166,910 B2 | 1/2007 | Minervini | |
| 7,436,054 B2 | 10/2008 | Zhe et al. | |
| 8,493,748 B2* | 7/2013 | Camacho | H01L 23/047 361/760 |
| 2007/0205492 A1 | 9/2007 | Wang | |
| 2008/0063232 A1 | 3/2008 | Song | |
| 2008/0157301 A1 | 7/2008 | Ramakrishna et al. | |
| 2008/0164545 A1 | 7/2008 | Hsiao | |
| 2008/0247585 A1 | 10/2008 | Leidl et al. | |
| 2008/0315333 A1* | 12/2008 | Combi | B81B 7/0061 257/415 |
| 2009/0101998 A1* | 4/2009 | Yen | B81C 1/0023 257/416 |
| 2009/0218668 A1 | 9/2009 | Zhe et al. | |
| 2010/0052082 A1* | 3/2010 | Lee | B81B 7/0061 257/416 |
| 2010/0284553 A1 | 11/2010 | Conti et al. | |
| 2010/0290644 A1* | 11/2010 | Wu | H04R 19/005 381/111 |
| 2012/0043628 A1* | 2/2012 | Martin | B81B 7/0048 257/416 |
| 2013/0108074 A1* | 5/2013 | Reining | H04R 3/005 381/92 |

FOREIGN PATENT DOCUMENTS

| | | |
|---|---|---|
| EP | 2 252 077 A1 | 11/2010 |
| WO | 2011/076910 A1 | 6/2011 |

\* cited by examiner

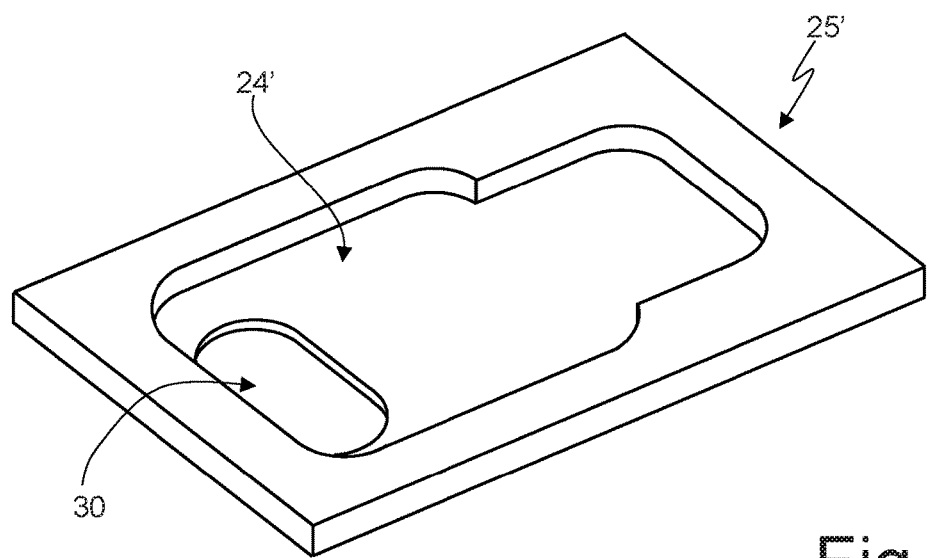
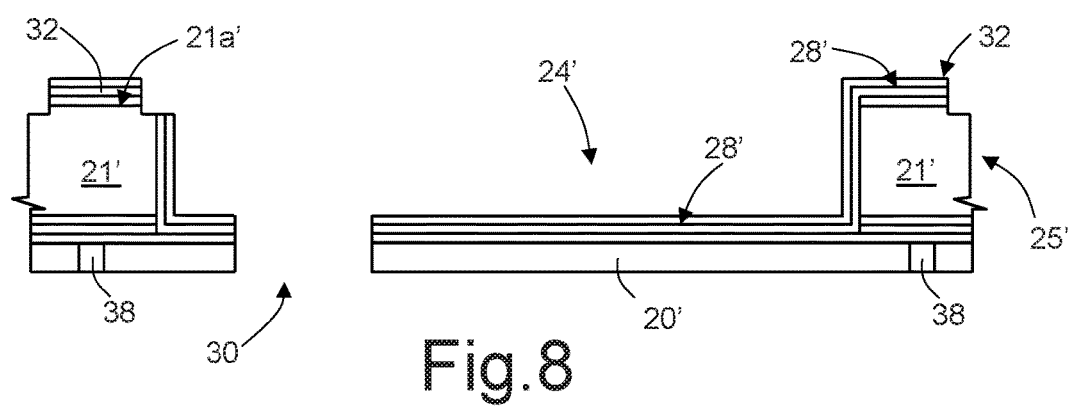

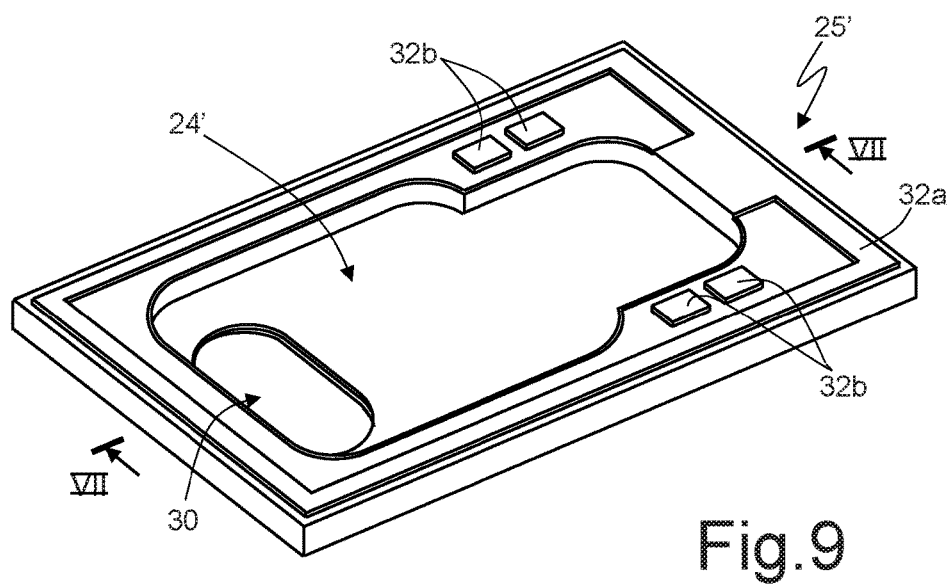
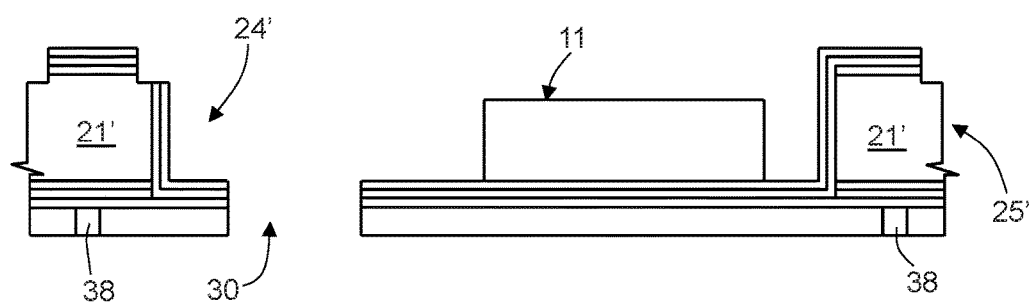

PACKAGE WITH CHAMBERS FOR DIES AND MANUFACTURING PROCESS THEREOF

BACKGROUND

Technical Field

The present disclosure relates to a package for a MEMS (Micro-Electro-Mechanical System) sensor, in particular a capacitive microphone, and to the manufacturing process thereof.

Description of the Related Art

As is known, a MEMS sensor, e.g., an acoustic transducer such as a capacitive microphone, generally comprises a micromechanical sensing structure, designed to convert a mechanical stress (e.g., acoustic pressure waves) into an electrical quantity (for example, by exploiting variations of the electrical quantity in a capacitive structure of the MEMS sensor due to the acoustic pressure waves), and reading electronics, designed to carry out appropriate processing operations (including amplification and filtering) of the electrical quantity for supplying an electrical output signal (for example, a voltage).

Generally, an MEMS acoustic transducer is formed in a die including a structural layer of semiconductor material, for example silicon, accommodating a cavity. A membrane, or diaphragm, extends on top of the cavity; the membrane is flexible and, in use, undergoes deformation as a function of the pressure of the incident sound waves. A rigid plate (generally referred to as "back-plate") extends at a distance from the diaphragm. The back-plate and the diaphragm thus form a movable electrode and a fixed electrode of a variable capacitor. The die further comprises contacts, used for biasing the membrane and the back-plate and for receiving an electrical signal resulting from the deformation of the membrane caused by the incident acoustic pressure waves.

The die implementing the acoustic transducer is enclosed in a package, accommodating also reading electronics associated thereto, generally provided as an ASIC in a respective die of semiconductor material.

A known package as above described is shown for clarity in FIG. 1.

FIG. 1 shows a package 1 including a cap 2 and a substrate 3. A first die 10, forming the MEMS sensing structure, and a second die 11, forming an ASIC integrating a reading electronics, are coupled side-by-side on the substrate 3. The first die 10 has a cavity 14 delimiting a diaphragm 15 (for simplicity, no back plate has been shown herein). Electrical connections 12 between the first and second dice 10, 11 and between the second die 11 and the substrate 3, are provided using a wire-bonding technique. Metallization layers and vias (not shown) are provided through the substrate 3 for routing the electrical signals towards the outside. Pads (in the case of an LGA—Land-Grid Array—package), or conductive spherical elements (in the case of a BGA—Ball-Grid Array—package), or similar connection elements, are moreover provided on the underside of the substrate 3 for soldering and electrical connection to an external printed circuit of a corresponding electronic device.

The cap 2 may be made of metal, or of a pre-molded plastic coated in the inside with a metallization layer, so as to prevent noise due to external electromagnetic signals (by providing a sort of Faraday cage). The cap 2 is generally attached to the substrate 12 by a conductive glue 17 so as to obtain also a ground connection towards the substrate 3. The cap 2 further has an opening 18 allowing acoustic pressure waves from the external environment to enter the package 1.

This known solution is susceptible of improvements. In particular, since the cap 2 is made by a molding technique, it requires specific and dedicated molding tools (comprising, for example, dies and punches), for each possible variation of dimensions and shapes, for example in case of variations of the silicon dimensions or in presence of different customer requirements. In addition, the pitch and layout of the molding and punching tools are not always compatible with the dimensions and configuration of the array of contacts.

Furthermore, this known solution has large dimensions for accommodating two dice side-by-side and arranging the cap, and in general it does not offer the designer a sufficient design freedom in sizing the front and back chambers of the acoustic transducer.

EP-1 755 360A discloses a package wherein the metal cap is secured to the substrate by welding rather than using a conductive epoxy.

US 2008/0063232 discloses a method of enclosing a silicon microphone in a plastic molded cap on which a metal layer has been deposited.

U.S. Pat. No. 7,166,910 in FIGS. 6-10 describes and shows a package layout with a MEMS transducer mounted on the top side of the package.

PCT/EP2010/070608, filed on 29 Dec. 2010 in the name of the same Applicant, discloses a package including a substrate carrying two dice including a MEMS chip and an ASIC; a wall structure, formed from a board and attached to the substrate to define a chamber accommodating the dice; and a cap layer upwardly closing the cavity. The dice are directly connected to connection elements formed on the face of the wall structure looking toward the cap layer.

All the above solutions may be improved in order to better exploit the available space and reduce the general bulk of the package for a given dimensions of the dice. In addition, a higher design freedom in sizing the back volume, on the back of the MEMS chip, is desirable.

BRIEF SUMMARY

One embodiment of the present disclosure is directed to a packaged MEMS device having a first support structure that includes a first chamber, a first support layer, and a first wall layer coupled to the first support layer, the first wall layer and the first support layer delimiting the first chamber. The MEMS device also includes a second support structure stacked on the first support structure, the second support structure including a second chamber, a second support layer, and a second wall layer coupled to the second support layer, the second wall layer and the second support layer delimiting the second chamber, the first chamber being delimited, at least in part, by the second support layer of the second support structure. A first die is on the first support layer in the first chamber and a second die is on the second support layer in the second chamber, and a lid is coupled to the second support structure, the lid configured to close the second chamber of the second support structure.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 2-6, 8, 10, 12 and 14 show cross-sections of intermediate structures, in subsequent manufacturing steps, according to an embodiment;

FIGS. 7, 9 and 16 are a perspective schematic views of the intermediate structures of FIGS. 6, 8 and 14, respectively;

DETAILED DESCRIPTION

FIGS. 2-17 show an embodiment of a process for manufacturing a package for a MEMS device and is based on the use of composite substrates that are stacked and bonded to each other. In particular, the following description regards the manufacture of a packaged device through stacking of at least two composite structures, each supporting at least one die, wherein each composite structure may be manufactured basically using the technology described in PCT/EP2010/070608 cited above.

FIGS. 2-17 show only a portion of layers and structures intended to form a single packaged MEMS device, but the same features shown and described repeat on the sides of the illustrated portions, for simultaneous manufacturing the a plurality of packaged MEMS devices.

Figure 2:
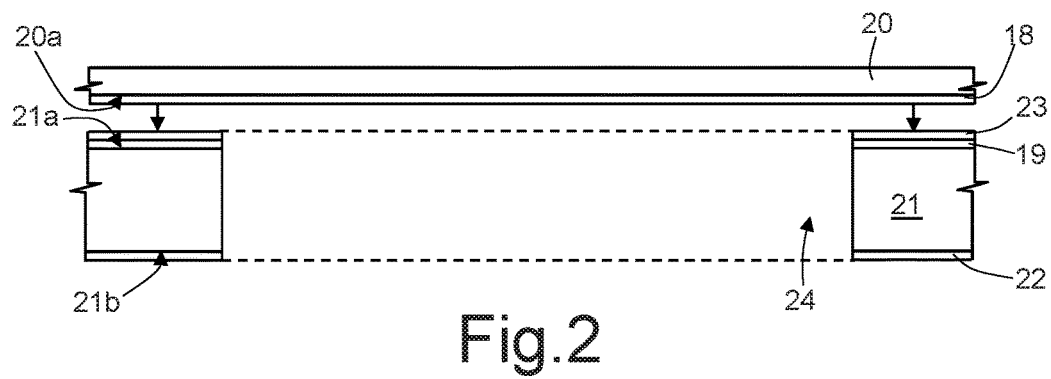
Figure 3:

FIG. 2 shows the coupling of a first and a second package layers 20, 21 (also indicated as a support layer and a wall layer) of a same plastic material, in particular an epoxy resin, and specifically a laminated BT (bismaleimide triazine) board, to form a first package substrate, also called first support substrate 25 (FIG. 3). Package layers 20, 21 may be made of the same plastic material. A first main face 20a of the first package layer 20 and first and second main faces 21a, 21b of the second package layer 21 are coated, using standard techniques, by thin, first metal layers 18, 19, 22. In addition, an adhesion layer 23, of non-conductive adhesive material, is formed e.g., on the first metal layer 19 covering the first main face 21a of the second package layer 21, which is intended to be bonded to the first package layer 20.

A chamber 24 has been formed (e.g., by a conventional routing process, laser drilling etc.) throughout the thickness of the second package layer 21, so as to locally remove also the first metal layers 19, 22 and the adhesive layer 23. Cavity 24 may have, for example, a rectangular or a circular shape and a bigger area than a MEMS device to be packaged.

Thereafter, as indicated by an arrow in FIG. 2, the first and second package layers 20, 21 are joined together, in a stacked way, to form a first composite substrate 25, shown in FIG. 3. Thereby a chamber, still designated by number 24 for simplicity, is formed, having lateral walls and a bottom. A seed layer 26 is grown over the remaining portions of the first metal layer 22 on the second main face 21b of the second package layer 21, the lateral walls and the bottom of chamber 24. Then, for example using an electroplating technique or a sputtering technique, a second metal layer 27 is grown on the seed layer 26 and coats, in particular, the inside of the chamber 24, forming, together with layers 18, 22 and 26, a coating layer 28, covering, i.e., the walls and the bottom of chamber 24.

Figure 4:
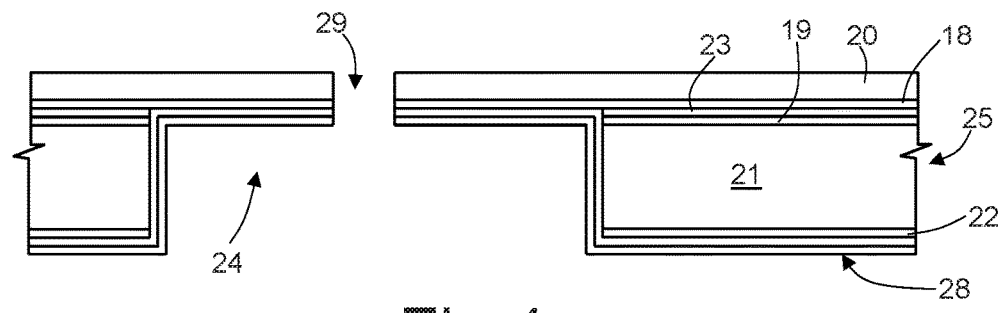

Then, FIG. 4, an access port 29, forming an acoustic access port, is formed through the first package layer 20, the first metal layer 18 and the coating layer 28, using standard micromachining techniques. The access port 29 has, for example, circular cross-section and, as will be clarified hereinafter, is designed to enable entry of acoustic pressure waves into the package of the MEMS acoustic transducer.

In this step, in a not shown manner, marking of the package can advantageously be carried out.

Figure 5:
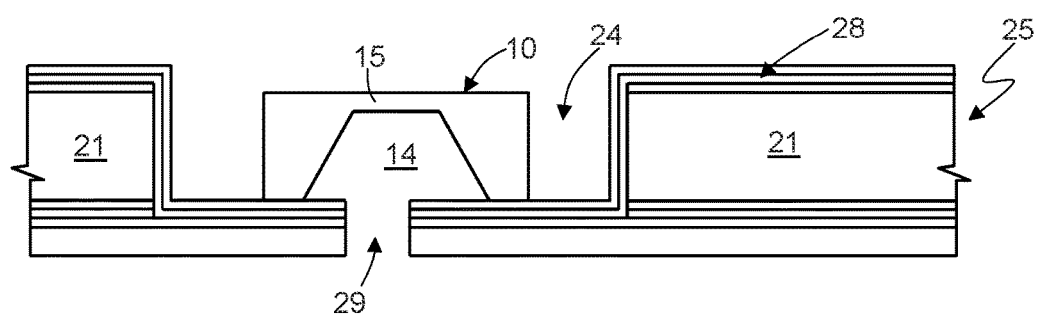

Thereafter, FIG. 5, the first composite substrate 25 is turned upside down and a first die, indicated again by 10 and integrating a micromechanical sensing structure, is bonded to the first composite substrate 25 above the access port 29. In particular, the first die 10 is arranged so that the cavity 14 defining the diaphragm 15 faces and is in fluid communication with the access port 29 to form a front chamber of a MEMS acoustic transducer.

Figure 6:
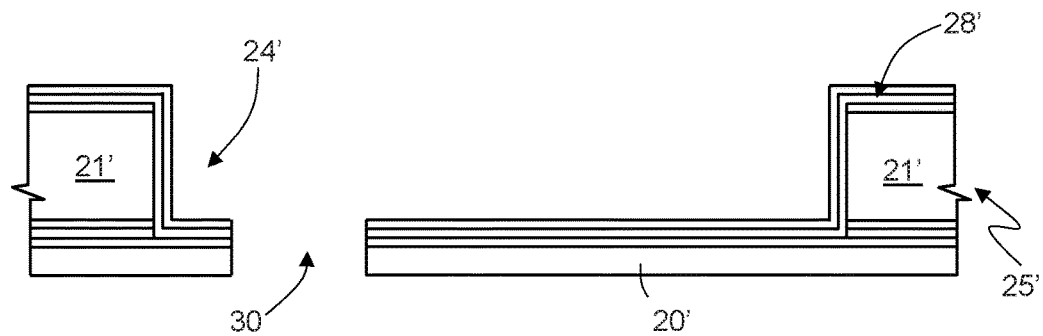

Meanwhile, FIGS. 6 and 7, a second composite substrate, indicated at 25', is worked as discussed above with reference to FIGS. 2-4. Thus, the second composite substrate 25' has a first package layer 20', a second package layer 21', a chamber 24' and a coating layer 28'. Here, a connection port 30 is formed instead of the access port 29. Connection port 30 may be larger than access port 29 and differently positioned, as discussed hereinafter. In particular, connection port 30 is arranged in a position such as to extend approximately above the first die 10, after coupling the composite substrates. Also chamber 24' may have a different shape from chamber 24 of the first composite substrate 25 (see FIG. 7). In addition, conductive vias 38 may be provided in the first package layer 20', to connect the coating layer 28' with the back of the second composite substrate 25', as discussed below.

Then, in FIGS. 8 and 9, the second composite substrate 25' undergoes a cutting process to form contact regions for connecting the device to the exterior. To this end, as disclosed in International Application PCT/EP2010/070608, cited above, standard cutting processes are used (so-called "sawing" operation), for example using a diamond-saw cutting tool. Thus, coating layer 28' and a surface portion of second package layer 21' are selectively removed for providing, at first surface 21a' of the second package layer 21', a plurality of contact regions 32, electrically insulated from one another (see FIG. 9). In particular, contact regions 32 may comprise a frame-shaped contact region 32a, extending all around chamber 24' and device contact regions 32b, of smaller dimensions and e.g., square shape. In addition, frame-shaped contact region 32a may be connected to the coating layer 28' on the bottom of the chamber 24' and/or be formed by a plurality of electrically insulated regions, if so desired.

Figure 1:
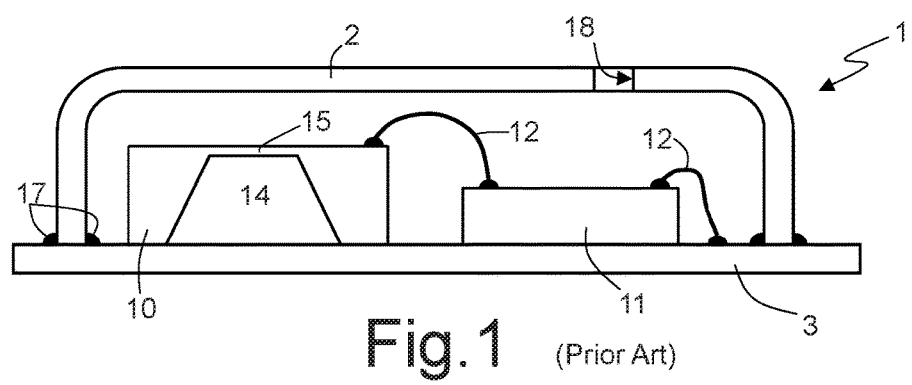
FIG. 1 is a schematic cross-section of a known packaged MEMS acoustic transducer.

Then, in FIG. 10, a second die 11, e.g., the ASIC integrating a reading electronics of FIG. 1, is bonded to the second composite substrate 25', laterally with respect to the connection port 30, for example using adhesive material (not shown), so that, after bonding the first and the second composite substrates 25, 25', the second die 11 is laterally offset with respect to the first die 10.

Figure 11:
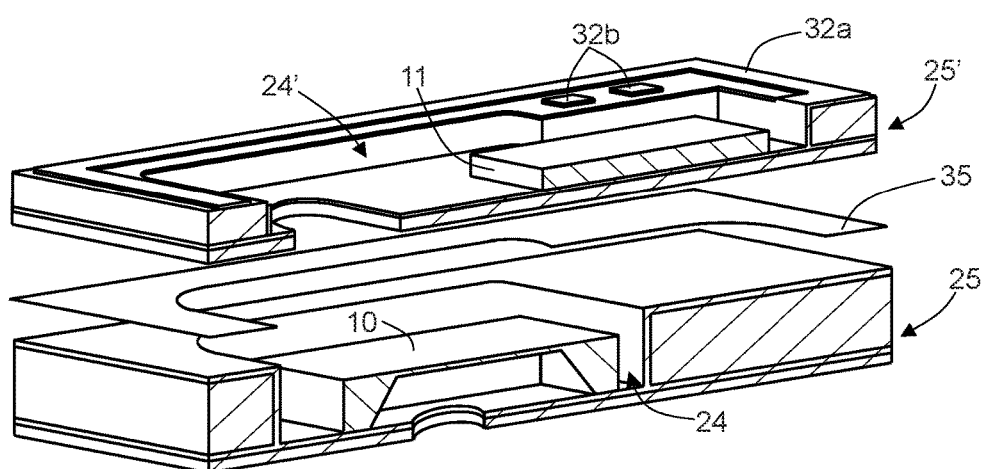
FIG. 11 is a perspective, cross-sectional view of the intermediate structures during a stacking step.
Figure 12:
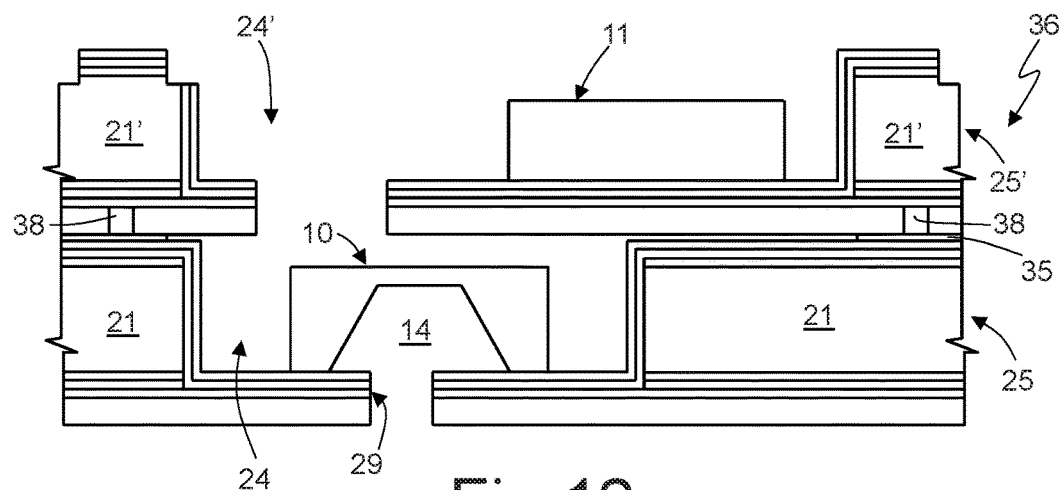
Figure 13:
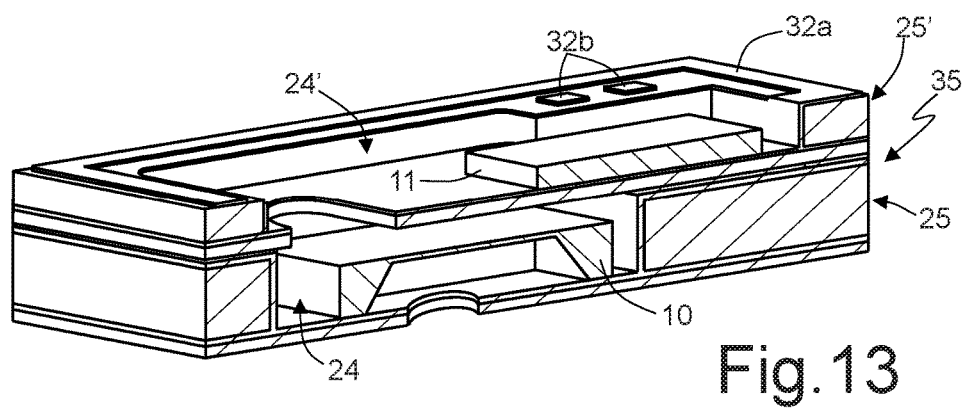
FIGS. 13 and 15 are perspective, cross-sectional views of the intermediate structures of FIGS. 12 and 16, respectively.

Thereafter, in FIGS. 11-13, the first and the second composite substrates 25, 25' are bonded together, for example by interposing a thin attach film 35 of attach material (not shown). The attach material may be a conductive adhesive medium if a full shielding of both chambers 24 and 24' is desired (with coating layers 28 and 28' electrically coupled through the conductive vias 38 in the first package layer 21', or not conductive, if a full shielding is not a requirement.

The thin attach film 35 may be applied to either the back surface of the second composite substrate 25' or to the front surface of the first composite substrate 25 and may be applied by any technique, such as screen printing or standard pump dispensing. After application of the thin attach film 35, the first and second composite substrates 25, 25' are stacked on each other and then bonded, using a standard curing process. Thereby, a multi-level stack substrate 36 is obtained, wherein the thin attach film 35 also acts as a sealing structure for the final packaged device.

Figure 14:
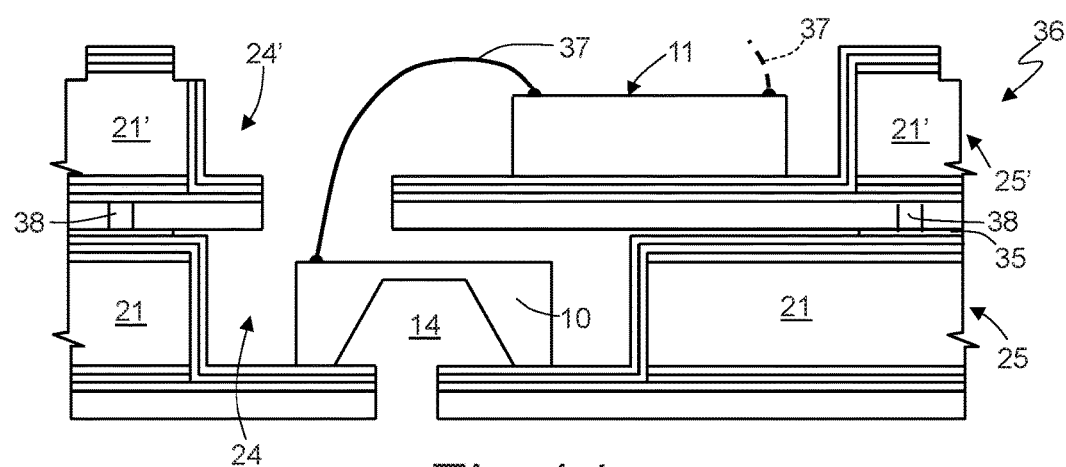
Figure 15:
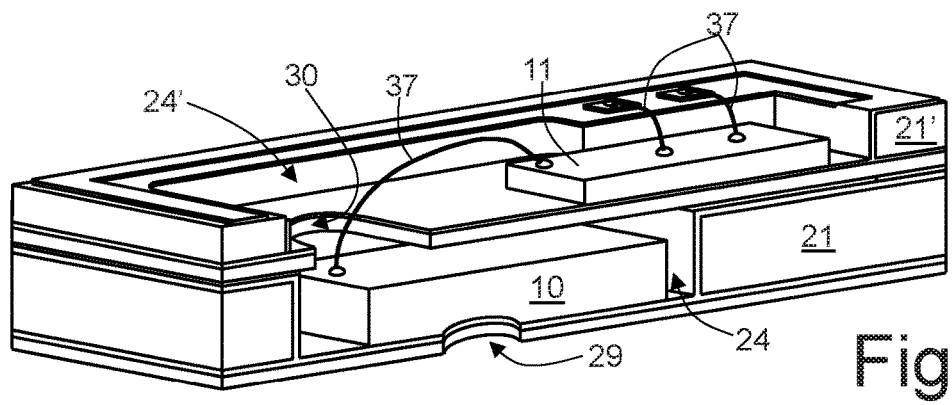
Figure 16:
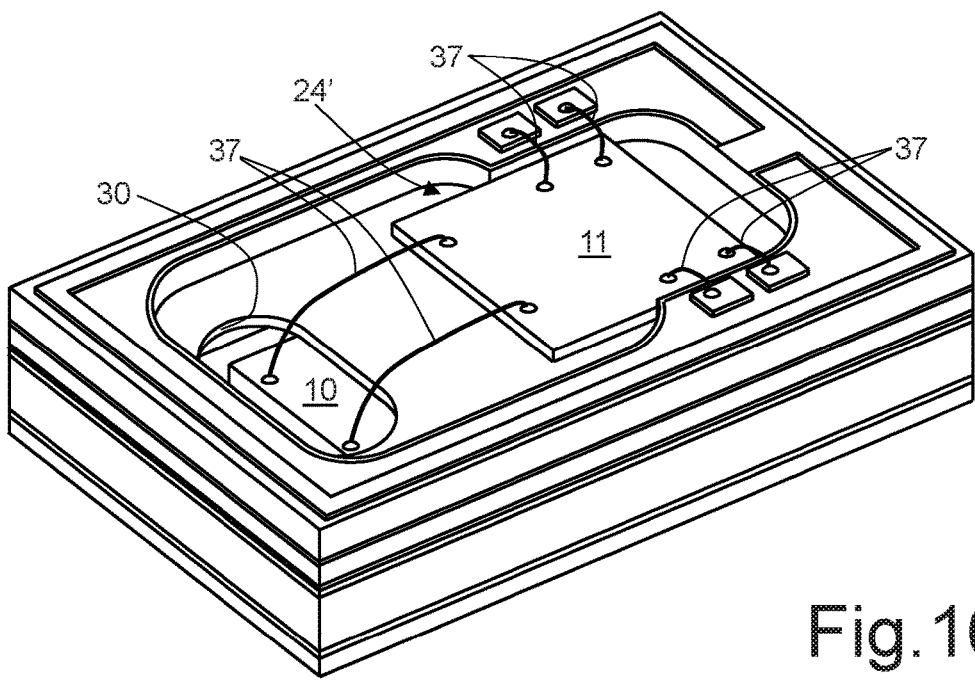
Figure 17:
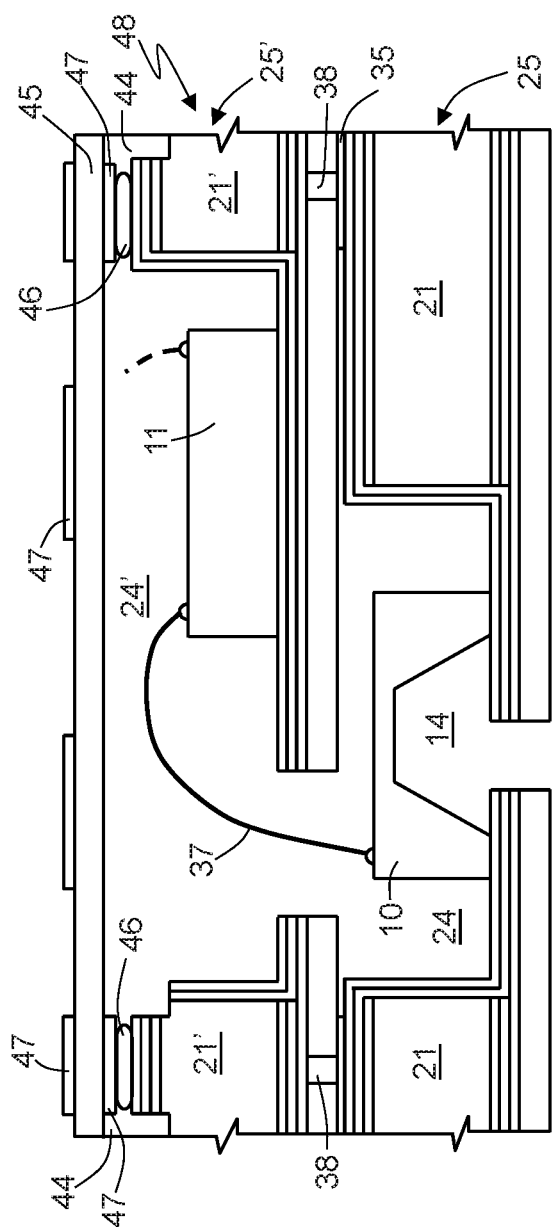
FIG. 17 is a cross-section of a packaged MEMS acoustic transducer obtained with the present process.

Then, FIGS. 14-16, electrical connections between the first and second dice 10, 11 the second die 11 and the device contact regions 32*b* are formed using a wire-bonding technique, forming wires 37.

Thereafter, a sealing material 44 (for example, a conductive resin) is applied to the second composite substrate 25', to seal each final device, after singulation. According to FIG. 17, a printed-circuit substrate 45 is attached to the multi-level stack substrate 36, using a flip-chip technique, after applying conductive bonding regions 46, e.g., of a solder-paste, to the contact regions 32. The printed-circuit substrate 45 has contact regions 47 on both its faces, to allow electrical connection with the multi-level stack substrate 36 and with the exterior. To this end, conductive, built-in through vias may be provided in the printed-circuit substrate 45 to electrically connect bottom contact regions 47 to upper contact regions 47. In some embodiments, the face of the printed-circuit substrate 45 looking toward the multi-level stack substrate 36 may carry additional components (not shown), electrically connected by other contact regions, similar to contact regions 47.

Subsequently, the stacked assembly of the printed-circuit substrate 45 and the multi-level stack substrate 36 is subjected to brazing (so-called "reflow"), so as to obtain their mechanical and electrical bonding, by soldering. Thereby, a package structure 48 is formed.

Finally, using traditional cutting techniques, the package structure 48 is cut to obtain a plurality of packaged devices 49 (FIG. 19), e.g., packaged MEMS acoustic transducers. The finished devices are then subjected to the usual testing procedures (so-called sorting operation).

The final packaged device 49 thus obtained includes a back chamber of the first die 10 (formed by the chamber 24 internal to the first composite substrate 25) that is generally distinct from the chamber 24' defined by the second composite substrate 25' by being upwardly closed by the first layer 20' of the second composite structure 25'.

This structure allows the first die 10 to be separated from other components (such as the second die 11 or any further components bonded to the printed-circuit substrate 45), and the optimization of the dimensions of the back chamber 24 to the specific requirements. In fact, the thickness of the back chamber 24 may be modified by appropriately dimensioning the second package layer 21 and its area may also be optimized during the machining of the chamber 24. Also the dimensions of the connection port 30 may be selected in order to optimize the separation of the back chamber 24 from the second chamber 24'. In fact, in acoustic transducers, the volume of the front chamber 14 (i.e., the space traversed in use by acoustic pressure waves coming from the outside through access port 29), and the volume of the back-chamber 24, set in use at a reference pressure, directly affect the acoustic performance of the transducer.

By virtue of the stacking, the bulk of the packaged device 48 is greatly optimized, since it is possible to arrange the dice in a stacked way. On the other hand, since each die is supported by a separate bearing layer (second package layer 21), the overall packaged device 48 is very robust, thus allowing also multiple stacking. In practice, the overall package is of a modular structure, including a plurality of stacked, distinct chambers that may be generally separated from each other, wherein the level of separation depends on the dimensions of the through holes in the first package layers (support layers) of the overlying composite structures 25, 25'.

In addition, since each level includes a support layer, a high level of overlapping of the dice may be obtained, if desired, thereby increasing the reduction in the overall bulk.

In addition, both the first and the second dice 11, 12 are sealed from the external environment and also shielded from electromagnetic disturbance by virtue of the coating layers 28, 28' surrounding chambers 24, 24'. However, the shielding may be applied to only one of the dice 11, 12, if so desired, in which case no through vias 38 need to be formed.

The use of a multi-level cavity structure allows the first die 10 to be assembled directly on the package access port 29, for optimal frequency response, and allows stacking of other devices while keeping the first die 10 substantially separated therefrom, as above discussed.

The connection between the first die 10 and the second die 11 through wires allows any parasitic capacitance to be kept to a minimum.

In practice, the present package and method improves upon the technique taught in PCT/EP2010/070608 for manufacturing a multiple-chamber package that allows an optimal fine tuning of both the front and the back chambers for high performance, minimizing the floor space by stacking two or more cavities on top of each other and attaining direct connection of a MEMS to an ASIC. This is particularly advantageous when the MEMS device is a capacitive sensor, for example an acoustic transducer, since in this case parasitic capacitances are crucial for the capacitive sensor performance and thus a very good connection between the sensor and the control dice is very critical.

Figure 18:
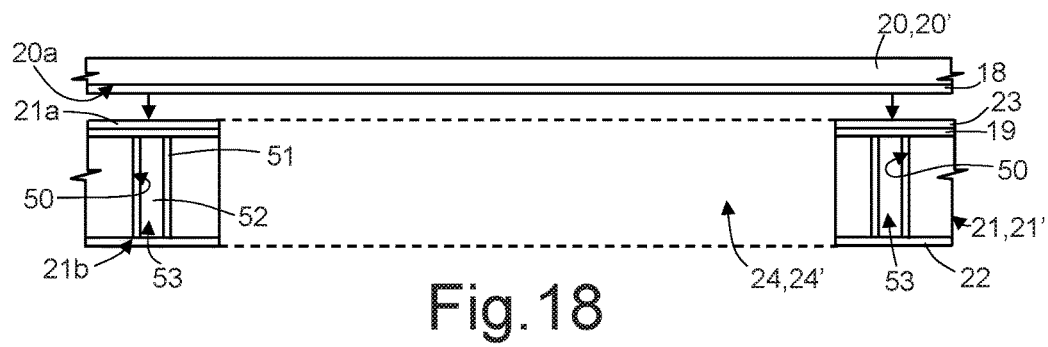
FIG. 18 is a cross-section of an intermediate structure, according to a different embodiment.

According to a different embodiment, the bottom of chamber 24 (formed by the first package layer 20) is connected to the top of the first composite substrate 25 by through vias. In this case, of FIG. 18, before bonding the first and second package layers 20, 21 and before forming the first metal layers 19, 22 on the first and second main faces 21*a*, 21*b* of the second package layer 21, holes 50 are formed throughout the thickness of layer 21, the walls of the holes 50 are covered by a metal layer 51 and, possibly, the holes are filled with conductive or insulating material 52, thereby forming vias 53. Then, the first metal layers 19, 22 on the first and second main faces 21*a*, 21*b* of the second package layer 21 are deposited, as well as an adhesion layer 23. Thereafter, the same step above discussed with reference to FIGS. 3-17 are performed, including forming the first chamber 24 and bonding the first and second layers 20, 21 to obtain the first composite layer 25, forming the second composite layer 25', bonding the dice 10, 11; bonding the first and second composite layers 25, 25'; wire bonding the dice 10, 11 to each other and to the contact regions 32; bonding the printed-circuit substrate 45 and singulating the packaged devices 49.

Figure 19:
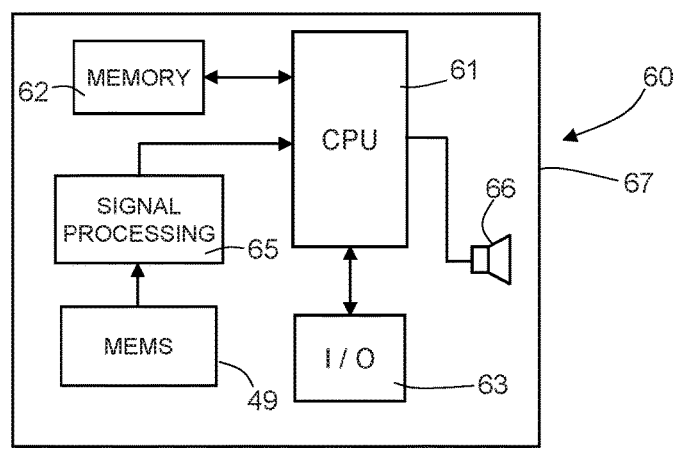
FIG. 19 shows a general block diagram of an electronic device incorporating the present MEMS acoustic transducer.

The packaged device 49 may be used in an electronic device 60, as shown in FIG. 19. The electronic device 60 is preferably a mobile communications device, such as, for example, a cell phone, a PDA, a notebook, but also a voice recorder, an audio-file reader with voice-recording capacity, etc. Alternatively, the electronic device 60 may be a hydrophone, capable of working under water, or else a hearing-aid device.

The electronic device 60 may comprise a microprocessor (CPU—central processing unit) 61, a memory block 62, connected to the microprocessor 61, and an input/output interface 63, for example provided with a keyboard and a display, which is also connected to the microprocessor 61. The MEMS packaged device 49 communicates with the microprocessor 61. In particular, the ASIC in the second die 11 sends electrical output signals to the microprocessor 61 (a further electronic circuit for processing these electrical output signals 65 may possibly be present). A loudspeaker 66 is also provided for generation of sounds on an audio output (not shown) of the electronic device 60. As shown schematically, the MEMS packaged device 49, the microprocessor 61, the memory block 62, the input/output interface 63, and the possible further electronic components are coupled to a single printed circuit board 67, for example using the SMD technique.

Finally, it is clear that modifications and variations may be made to what has been described and illustrated herein, without thereby departing from the scope of the present disclosure.

In particular, the connections between the coating layers 28, 28' in the first and second composite layers 25, 25' may differ with respect to the described solution and may be obtained using any known technique and means; coating layers 28 and/or 28' may be missing, if not needed; the connections to the outside may be obtained in any known way, and the stacked solution may be applied to any dice wherein distinct back chambers are desired.

The stacking procedure may be repeated so as to obtain multiple-level composite structures.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first substrate;
a second substrate attached to the first substrate;
a first chamber formed by the first substrate and the second substrate;
a first die on the first substrate and positioned in the first chamber;
a third substrate attached to the second substrate, the second substrate positioned between the first substrate and the third substrate;
a second chamber formed by the third substrate and the second substrate;
a second die on the second substrate and positioned in the second chamber; and
a connection port that extends through the second substrate, the first chamber being spaced from the second chamber by the connection port, the first die being electrically coupled to the second die via the connection port, at least a portion of the connection port directly overlying the first die; and
a wire electrically coupling the first die to the second die, the wire extending from the first die, through the second substrate via the connection port, and to the second die.

2. The device of claim 1, wherein:
the first substrate includes a laminated bismaleimide triazine board.

3. The device of claim 1, wherein:
the first substrate is a first composite substrate including a first package layer joined to a second package layer, and
the first die is on the first package layer.

4. The device of claim 3, wherein:
the second substrate is a second composite substrate including a third package layer joined to a fourth package layer, and
the second die is on the third package layer.

5. The device of claim 1, wherein:
the first die is a micro-electro-mechanical system; and
the second die is an application-specific integrated circuit.

6. The device of claim 1, further comprising:
an inlet through the first substrate.

7. The device of claim 6, wherein:
the first die includes a diaphragm aligned with the first inlet.

8. A system, comprising:
a processor;
memory coupled to the processor;
a device coupled to the processor, the device including:
    a first substrate;
    a second substrate attached to the first substrate;
    a first chamber formed by the first substrate and the second substrate;
    a first die on the first substrate and positioned in the first chamber;
    a third substrate attached to the second substrate;
    a second chamber formed by the third substrate and the second substrate;
    a second die on the second substrate and positioned in the second chamber;
    a connection port that extends through the second substrate, the first chamber being spaced from the second chamber by the connection port; and
    a wire electrically coupling the first die to the second die, the wire extending from the first die, through the connection port, and to the second die, the wire being spaced from sidewalls of the connection port.

9. The system of claim 8, wherein:
the first die includes a diaphragm aligned with an inlet though the first substrate.

10. The system of claim 8, wherein:
the first die is a micro-electro-mechanical system; and
the second die is an application-specific integrated circuit.

* * * * *